(12) United States Patent
Janssen et al.

(10) Patent No.: US 11,391,767 B2
(45) Date of Patent: Jul. 19, 2022

(54) MEASURING ARRANGEMENT AND METHOD FOR MONITORING A CABLE

(71) Applicant: LEONI KABEL GMBH, Roth (DE)

(72) Inventors: Bernd Janssen, Friesoythe ot Neuscharrel (DE); Heiko Weber, Nortmoor (DE)

(73) Assignee: Leoni Kabel GmbH, Roth (DE)

( * ) Notice: Subject to any disclaimer, the term of this patent is extended or adjusted under 35 U.S.C. 154(b) by 0 days.

(21) Appl. No.: 16/982,667

(22) PCT Filed: Jan. 18, 2019

(86) PCT No.: PCT/EP2019/051218
§ 371 (c)(1),
(2) Date: Sep. 21, 2020

(87) PCT Pub. No.: WO2019/179671
PCT Pub. Date: Sep. 26, 2019

(65) Prior Publication Data
US 2021/0018552 A1 Jan. 21, 2021

(30) Foreign Application Priority Data
Mar. 19, 2018 (DE) .......................... 102018204174

(51) Int. Cl.
*G01R 31/11* (2006.01)
(52) U.S. Cl.
CPC .................................. *G01R 31/11* (2013.01)

(58) Field of Classification Search
CPC .. G01R 31/08–11; G01R 31/50; G01R 31/58; G01R 31/59; G01R 31/60
See application file for complete search history.

(56) References Cited

U.S. PATENT DOCUMENTS

| 5,225,814 A * | 7/1993 | Choi ...................... G01R 31/58 340/635 |
| 6,906,526 B2 * | 6/2005 | Hart, Jr. ................. H04N 17/00 348/E17.001 |
| 6,980,007 B1 * | 12/2005 | Lo ......................... G01R 31/088 324/543 |
| 9,442,880 B2 | 9/2016 | Sixt |
| 10,488,273 B2 | 11/2019 | Koeppendoerfer et al. |
| 10,690,550 B2 | 6/2020 | Janssen |

(Continued)

FOREIGN PATENT DOCUMENTS

| DE | 102012101881 A1 | 9/2013 |
| DE | 102013227051 A1 | 6/2015 |

(Continued)

*Primary Examiner* — Huy Q Phan
*Assistant Examiner* — David B Frederiksen
(74) *Attorney, Agent, or Firm* — Laurence A. Greenberg; Werner H. Sterner; Ralph E. Locher

(57) ABSTRACT

A measuring arrangement for monitoring a cable extending in a longitudinal direction includes a cable core having at least one electrical line element for transmitting electrical data or electric power, a signal unit for feeding a measurement signal into the cable core and for detecting a response signal, a sensor unit having a sensor line extending in the longitudinal direction and being disposed inside the cable core, and a monitoring unit. A method for monitoring a cable which extends in a longitudinal direction is also provided.

15 Claims, 1 Drawing Sheet

(56) References Cited

U.S. PATENT DOCUMENTS

| | | | |
|---|---|---|---|
| 2006/0290356 A1* | 12/2006 | Pham | G01R 31/11 324/533 |
| 2010/0156437 A1* | 6/2010 | Cobb | G01R 31/58 324/614 |
| 2011/0015882 A1 | 1/2011 | Guilhemsang et al. | |
| 2013/0162262 A1 | 6/2013 | Johnson et al. | |
| 2016/0290876 A1* | 10/2016 | Koeppendoerfer | G01K 7/16 |
| 2019/0107574 A1 | 4/2019 | Koeppendoerfer et al. | |
| 2019/0271732 A1 | 9/2019 | Janssen et al. | |

FOREIGN PATENT DOCUMENTS

| | | |
|---|---|---|
| DE | 102016121395 A1 | 10/2017 |
| DE | 102016210601 A1 | 12/2017 |
| EP | 3285077 A1 | 2/2018 |
| WO | 2017216061 A1 | 12/2017 |
| WO | 2018086949 A1 | 5/2018 |

\* cited by examiner

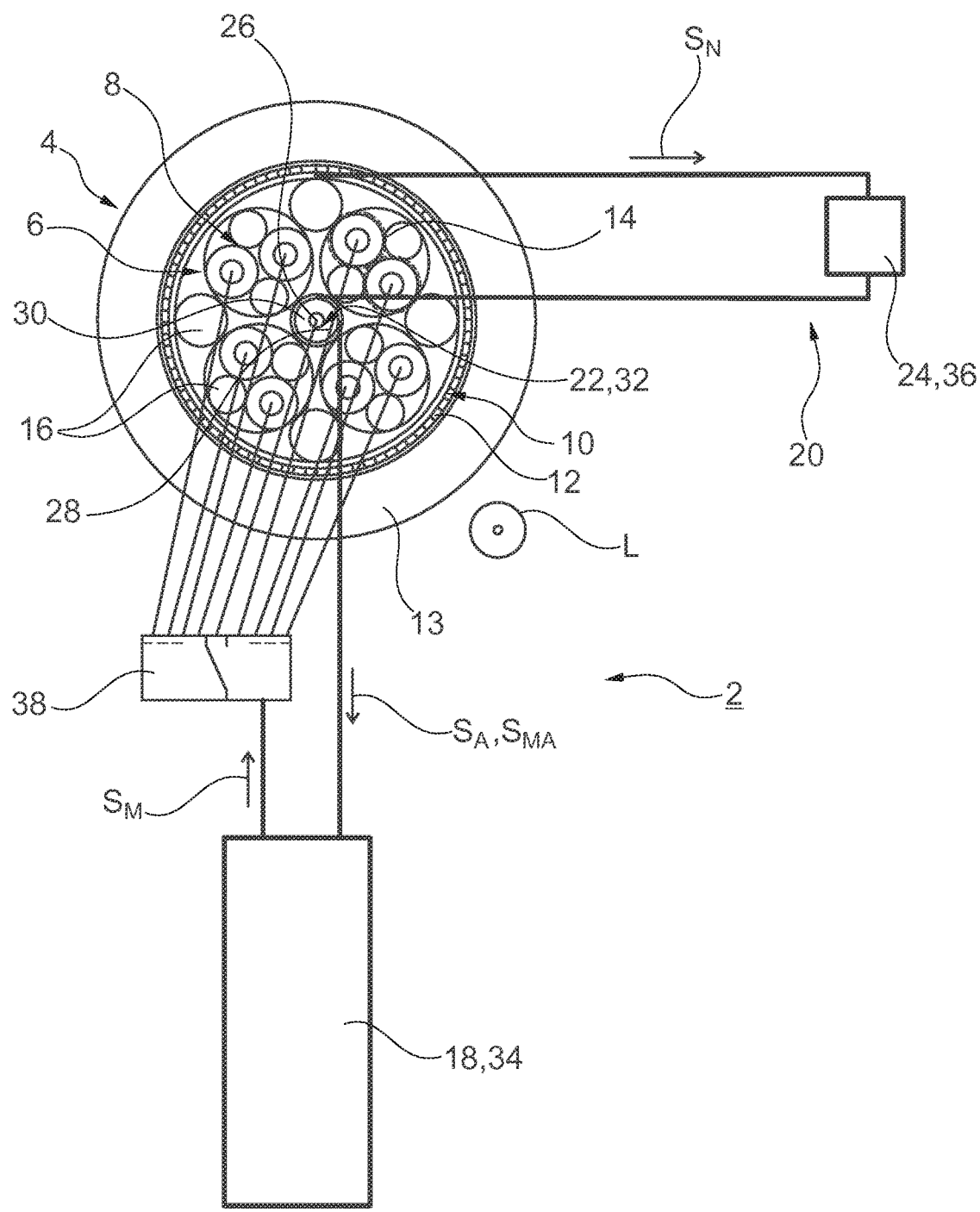

MEASURING ARRANGEMENT AND METHOD FOR MONITORING A CABLE

BACKGROUND OF THE INVENTION

Field of the Invention

The invention relates to a measuring arrangement and to a method for monitoring a cable.

Cables are used for example to transmit energy and/or signals and to this end have at least one strand, usually a plurality of strands, that is to say insulated conductors. A plurality of strands are often combined by way of a common line sheath so as to form a line element. A cable, in particular in the field of data transmission, usually has a plurality of line elements. Specifically in the case of data or signal lines, shielding layers are often also formed. In many applications, for example in the automotive sector, cables are subject to diverse loadings, which are unknown in terms of duration and intensity. The frequently varying environmental conditions, for example thermal influences, are often also not able to be estimated or not able to be estimated sufficiently so as to be able to predict the wear of a cable. The cables are additionally often also subject to mechanical loading, for example caused by vibrations, which may lead to damage. In order to be able to guarantee a certain minimum service life, cables and in particular the line elements are therefore typically designed to be over dimensioned. As an alternative, there is also the option to monitor and to inspect the cable during operation or at least at regular intervals.

In particular in the case of cables that have a plurality of line elements having a plurality of strands, such monitoring proves to be complex. A further aspect of such cables is that transmission of electrical data (for example Cat5 cables) or electric power should not be disrupted or impaired by monitoring. It is possible in principle to monitor and to survey such cables, and in particular their line elements, but isolation of the line elements from a connection, for example a plug, as required for this purpose, is highly complex.

SUMMARY OF THE INVENTION

On this basis, the invention is based on the object of specifying a measuring arrangement and a method by way of which a cable is able to be monitored easily and with little complexity.

The object with respect to the measuring arrangement is achieved according to the invention by a measuring arrangement for monitoring a cable extending in a longitudinal direction.

The cable in this case has a cable core having at least one electrical line element. The line element is used to transmit electrical data or electric power. The line element is in this case designed as a data line or as a supply line. The line element is preferably designed as a data line via which data, in particular high-frequency signals (having a frequency in the range of several MHz), are transmitted during operation.

The cable furthermore has a signal unit for feeding a measurement signal into the cable core and for detecting a response signal. The response signal is understood in this case specifically to be a signal that is correlated with the measurement signal and able to be influenced by the properties of the cable. Properties of the cable are in this case understood overall to mean both electrical properties, for example characteristic impedance, and mechanical (especially specific) properties, such as for example damage.

A sensor unit having a sensor line extending in the longitudinal direction and having a monitoring unit is furthermore provided. The sensor line is arranged inside the cable core. The monitoring unit is designed to recognize transmission pauses of the at least one line element. Transmission pauses are in this case understood to mean time intervals during which no transmission takes place through the at least one line element. That is to say, neither electrical data nor electric power are transmitted through the cable and in particular through the at least one line element during the transmission pauses.

The signal unit is electrically connected to the at least one line element in order to feed in the measurement signal. The signal unit is additionally designed such that the measurement signal is fed into the at least one line element during operation on the basis of the detected transmission pauses. The response signal is in this case detected and transmitted to an evaluation unit for evaluation. The evaluation unit is preferably integrated in a common structural unit with the signal unit. As an alternative, the evaluation unit is arranged remote from the signal unit, for example in a superordinate control unit, for example of a motor vehicle or of a maintenance center.

The measurement signal is fed into the at least one line element only when a transmission pause is currently taking place, that is to say no electrical data or electric power are being transmitted. The monitoring unit is in this case designed for example such that it conveys a signal to the signaling unit when no transmission has taken place for a predefined time, preferably >5 seconds, in particular >15 and for example 30 seconds. The measuring arrangement then assumes a transmission pause, and the signal unit then feeds the measurement signal into the at least one line element and performs a measurement. When the transmission through the at least one line element starts again during the measurement, this is recognized, in particular detected, by the monitoring unit, and a signal is output to the signal unit, which then stops feeding in the measurement signal.

This prevents the measurement signal from interfering with the transmission of data or power. The signal unit and the monitoring unit are in this case able to be configured in a manner specific to the application, for example with regard to expected transmission pauses. That is to say, in the present case, the above-described measuring arrangement may be used to monitor the cable, regardless of the transmission pauses that occur. The transmission pauses may in this case be recognized either by the previously mentioned monitoring unit or in a manner specific to the application, for example in the form of a predefined time or of a predefined date, for example: be stored in a preferably internal memory of the signal unit.

This makes it possible to monitor a cable, in particular during operation. Transmission pauses that occur during normal operation are in this case used to feed in the measurement signal and thus to measure the state of the cable. Normal operation and thus the transmission of the cable is in this case not influenced or disrupted.

The cable core preferably has an outer shield. The outer shield of the cable core is preferably electrically connected to the sensor line via the monitoring unit. This creates a kind of coaxial interconnection with the sensor line as inner conductor and the outer shield as outer conductor. As a result of this refinement, a crosstalk signal of the in particular unshielded line element is able to be detected by way of the monitoring unit during a transmission. Crosstalk is a fundamentally known and usually undesired effect that may occur during data transmission. Crosstalk occurs as a result of alternating fields when transmitting data, but also in the case of alternating fields. The crosstalk signal thus occurs only when transmission is taking place by way of the at least one line element. Due to this, a detected crosstalk signal indicates transmission. In other words: in the present case, the coupling of such a crosstalk signal into the outer shield is explicitly utilized in order conversely, on the basis thereof, to be able to determine the transmission pauses.

According to one expedient refinement, the sensor line has an inner conductor and an outer conductor. A dielectric is preferably arranged between the inner conductor and the outer conductor and is preferably dependent on a state variable, in particular the temperature.

According to one preferred development, the outer conductor is connected both to the signal unit and to the monitoring unit and is used to detect and evaluate the state variable, in particular the temperature. This easily integrates a state variable measurement, in particular a temperature measurement inside the cable. As an alternative, the state variable, in particular the temperature, is detected and evaluated in an external evaluation unit, and thus preferably independently of the signal unit.

According to one preferred refinement, the cable core has a plurality of line elements that are each electrically connected to the signal unit. The measurement signal is thus fed into a respective line element by the signal unit in the transmission pauses. That is to say, the measurement signal is preferably fed into the respective line elements successively, that is to say preferably not simultaneously.

The signal unit more preferably has a changeover switch element, for example a semiconductor changeover switch in the manner of an integrated circuit (IC). The line elements are in this case connected to the signal unit by way of the changeover switch element. The advantage of this refinement is that the measurement signal is able to be fed alternately into the line elements by the changeover switch element during operation. A single input to which the measurement signal is applied may thus be switched onto the individual line elements, which considerably reduces wiring expenditure in the context of producing the measuring arrangement.

The monitoring unit expediently has a comparator. A comparator is in this case understood to mean for example an electrical circuit that compares two voltages with one another. The two voltages are in this case firstly the detected crosstalk signal coupled into the outer shield and secondly a comparison voltage, in particular a comparison voltage value, that is used as a measure of a transmission that is taking place. That is to say, if, during operation, a crosstalk signal is coupled into the outer shield and thus also into the comparator, the value of which crosstalk signal is greater than the predefined value of the comparison voltage, then the monitoring unit detects transmission of data or power through the at least one line element. If the value of the coupled-in crosstalk signal drops below the predefined value of the comparison voltage or if the monitoring unit detects no coupled-in crosstalk signal, then no transmission is taking place through the at least one line element.

The sensitivity of the comparator, that is to say the value of the comparison voltage, should preferably be adjusted to a level of the expected coupled-in crosstalk signal in order to ensure reliable detection of the transmission pauses. Such adjustment preferably takes place in a manner specific to the application and flexibly, for example in a software-based manner in the context of commissioning, production or during operation of the measuring arrangement. Transmission pauses are thus also detected in the case of different data or power transmissions.

The sensor line, in particular the outer conductor, is preferably used as return line for the response signal to the signal unit, in particular for the reflected measurement signal component.

The response signal is expediently a measurement signal component reflected by the cable core, in particular by the at least one line element, to the signal unit. The measurement signal component is typically reflected at sites of the cable that exhibit damage, for example a fracture. The reflected measurement signal component may thus be used to make a statement about a state of the cable.

The reflected measurement signal component is preferably evaluated in this case taking into consideration a known (signal) attenuation in the at least one line element and/or the outer conductor of the sensor line. In other words, in the evaluation, a reduction in the signal amplitude of the measurement signal or of the reflected measurement signal component due to a propagation path in the line element is taken into consideration.

By evaluating the (signal) time of flight between the infeed of the measurement signal and the arrival of the reflected measurement signal component, it is possible to conclude as to the location of the damaged site on the cable. The measurement signal is in particular a measurement pulse, in particular in the manner of a voltage jump or a voltage level. The duration of the measurement signal or measurement pulse is in this case preferably greater than or equal to an expected time of flight of the measurement signal from the infeed location to an end of the at least one line element and back to the infeed location again. This ensures that a reflected measurement signal component is overlaid at the infeed location with the fed-in (constant) voltage amplitude.

For a spatially resolved measurement or in order to evaluate and/or determine the position of a local damaged site on the cable, a time-of-flight measurement, for example in the form of time domain reflectometry (TDR for short), is possible. In this case, a measurement pulse is fed into the at least one line element and the voltage profile of the reflected signal component is evaluated.

As an alternative to a TDR measurement, a measurement method as described in the international application by the applicant, not yet published at the time of this application, dated Oct. 30, 2017 with the filing number PCT/EP 2017/077828, is used. The disclosure content thereof, in particular the claims thereof (with the associated explanations) are hereby expressly incorporated into the present application. Reference is made especially to claims 1, 2, 6, 7 and 12 with the associated explanations, especially on pages 5/6 and 8/9. In this case, in the course of a measurement cycle, a plurality of individual measurements are performed, wherein a measurement signal is fed into the at least one line element by the signal unit per individual measurement, wherein a stop signal is generated in the event of a predefined (voltage) threshold value being exceeded (at the infeed location) as a result of the reflected measurement signal component, wherein a time of flight between the infeed of the measurement signal and the stop signal is ascertained, and wherein the (voltage) threshold value is changed between the individual measurements.

Precisely one stop signal is therefore generated at each individual measurement. Due to the threshold value that is changed between the individual measurements, different interference sites (the damaged sites on the cable that are mentioned here), which thus lead to amplitudes of different levels at the reflection—are detected in a spatially resolved manner through the different times of flight. In other words, the distance or impedance changes in the sensor line along the cable core are detected in a spatially resolved manner. The time of flight may thus be used to determine a position determination of the damaged site, and evaluating the number and magnitude of the impedance changes makes it possible to determine the extent of the damaged site. The times of flight (stop signals) of the reflected components are therefore detected by the multiplicity of individual measurements, generally at different defined threshold values. In this respect, this method may be considered to be a voltage-discrete time measurement method. The number of individual measurements is in this case preferably more than 10, more preferably more than 20 or even more than 50 and for example up to 100 or even more individual measurements. A multiplicity of stop signals is thus ascertained from the multiplicity of these individual measurements, these stop signals being arranged in a temporally distributed manner.

The multiplicity of stop signals in connection with the threshold values therefore approximately represents the actual signal profile of the fed-in measurement signal and of the reflected components.

A comparator is in this case in particular integrated in order to detect the exceedance of the threshold value.

The times of flight (stop signals) of the reflected measurement signal components are therefore detected by the multiplicity of individual measurements, generally at different defined threshold values. In this respect, this method may be considered to be a voltage-discrete time measurement method. The number of individual measurements is in this case preferably more than 10, more preferably more than 20 or even more than 50 and for example up to 100 or even more individual measurements.

As an alternative, the function of the comparator may be implemented by way of the measurement method described in PCT/EP 2017/077828 in order to recognize and to monitor the transmission pauses. The abovementioned comparator is especially used to detect exceedance of the threshold value.

According to one preferred refinement, the at least one line element has an unshielded pair of strands, preferably a twisted unshielded pair of strands in the manner of a twisted-pair line. The line element and in particular the cable are preferably an in particular pure data cable, for example in the manner of a Cat5 cable.

The sensor line is expediently arranged centrally around the cable core and surrounded by the at least one line element. This refinement is based on the observation that the crosstalk signal is thus able to be detected in an optimal manner by the monitoring unit during transmission. The in particular unshielded refinement of the at least one line element furthermore advantageously contributes thereto, since the crosstalk signal—as desired—is not shielded.

The object with respect to the method is achieved by a method for monitoring a cable extending in a longitudinal direction using a measuring arrangement. The cable is the cable already described above, having a cable core with at least one line element. The measuring arrangement is the measuring arrangement already described in the context of this application.

In the method, transmission pauses in the transmission of the electrical data or of the electric power are recognized and detected, and the measurement signal is fed into the at least one line element on the basis of the detected transmission pauses. The response signal, in particular a reflected measurement signal component, is detected and transmitted to an evaluation unit for evaluation.

The transmission pauses are preferably recognized and detected on the basis of a crosstalk signal caused by the transmission of the electrical data or of the electric power.

The advantages and preferred refinements explained with regard to the measuring arrangement may be transferred analogously to the method, and vice versa.

One exemplary embodiment of the invention is explained in more detail below with reference to the figures. In the figures, highly simplified illustrations are used.

BRIEF DESCRIPTION OF THE DRAWING

The FIGURE shows a schematic block circuit diagram of a measuring arrangement for monitoring a cable.

DETAILED DESCRIPTION OF THE INVENTION

The FIGURE illustrates a block circuit diagram of a measuring arrangement 2 for monitoring a cable 4 extending in a longitudinal direction L.

The cable 4 has a cable core 6 with four electrical line elements 8 in the exemplary embodiment. The line elements 8 are used to transmit electrical data or to transmit electric power. In the exemplary embodiment, the cable 4 is designed as a Cat5 cable for data transmission. In the exemplary embodiment, the cable core 6 and the outer shield 12 are surrounded jointly by a protective sheath 13.

The cable core 6 is surrounded circumferentially on an outer side 10 by an outer shield 12. Each line element 8 has an unshielded pair of strands 14, in the exemplary embodiment a twisted pair of strands 14 (identified in the FIGURE by the dashed border). For stabilization purposes and in order to achieve a preferably round cross-sectional geometry, filler elements 16 are arranged inside the cable core 6 in the exemplary embodiment.

The measuring arrangement 2 furthermore has a signal unit 18 for feeding a measurement signal $S_M$ into the cable core 6. In the exemplary embodiment, the signal unit 18 is configured and designed such that the measurement signal $S_M$ is able to be fed into each pair of strands 14 during operation. The signal unit 18 is furthermore designed to detect a response signal $S_A$.

The signal unit 18 is electrically connected to the electrical line elements 8, in the exemplary embodiment to each strand of a respective pair of strands 14, in order to feed in the measurement signal $S_M$.

A sensor unit 20 having a sensor line 22 extending in the longitudinal direction L and having a monitoring unit 24 is furthermore provided. The sensor line 22 is arranged inside the cable core 6, in the exemplary embodiment centrally inside the cable core 6, such that the sensor line 22 is surrounded by the line elements 8. In the exemplary embodiment, the sensor line 22 has an inner conductor 26 and an outer conductor 28, and is thus designed in the manner of a coaxial line. A state variable-dependent, in the exemplary embodiment temperature-dependent dielectric 30 is arranged between the inner conductor 26 and the outer conductor 28. This allows a temperature inside the cable core 6 to be detected.

The sensor line 22 is likewise electrically connected to the signal unit 18 and is used as a return line 32 for the response signal $S_A$. In order to monitor the cable 4, in particular in order to detect damaged sites along the cable 4, a method as has already been described in WO 2017/216061 A1 is preferably used. On the basis thereof, the response signal $S_A$ is a measurement signal component $S_{MA}$ reflected by the cable core 6 and in particular by the line elements 8, the superimposition of which—expressed in simplistic terms—with the fed-in measurement signal $S_M$ makes it possible to conclude as to the site and the extent of damage to the line elements 8.

The detected response signal $S_A$ is transmitted to an evaluation unit 34 for evaluation during operation. In the exemplary embodiment, the evaluation unit 34 is part of the signal unit 18. As an alternative, the evaluation unit 34 and also the evaluation of the detected response signal $S_A$ are spatially independent and temporally independent of the measuring arrangement or the detection of the response signal $S_A$.

The monitoring unit 24 is designed such that it recognizes and monitors transmission pauses in a transmission of data through the line elements 8. To this end, the monitoring unit 24 is electrically connected both to the outer shield 12 of the cable core 6 and to the sensor line 22, in the exemplary embodiment to the outer conductor 28 of the sensor line 22. This forms a coaxial design in the intermediate space of which the line elements 8 are arranged. During operation, that is to say during transmission through the in particular unshielded line elements 8, an interfering signal, in the exemplary embodiment a crosstalk signal $S_N$, is thus coupled into the monitoring unit 24. The crosstalk signal $S_N$ thus represents transmission taking place through the line elements 8. The monitoring unit 24 additionally has a comparator 36. The comparator 36 is used to compare the coupled-in crosstalk signal $S_N$ with a predefined and application-specific comparison value. If the crosstalk signal $S_N$ exceeds the comparison value, the monitoring unit 24 detects transmission taking place and conveys this to the signal unit 18. In order not to interfere with the transmission through the line elements 8 and, by contrast, in order not to distort the measurement signal $S_M$ and the response signal $S_A$ through transmitted data, the measurement signal $S_M$ is fed in, and the individual line elements 8 are therefore measured, only in the abovementioned transmission pauses.

In order to be able to apply the measurement signal $S_M$ for a measurement to all of the line elements 8 arranged inside the cable core 6 and in particular the pairs of strands 14, the signal unit 18 has a changeover switch element 38, for example a semiconductor changeover switch in the manner of an integrated circuit (IC) or a high-frequency switch element. The changeover switch element 38 is connected to the signal unit 18 such that the measurement signal $S_M$ is fed into the changeover switch element 38 on the input side. The changeover switch element is connected on the output side in each case to the individual strands of the pairs of strands 14 and to the inner conductor 26, the outer conductor 28 and to the outer shield 12. The changeover switch element 38 then switches the measurement signal $S_M$ interchangeably to each strand of the pair of strands 14 during operation for measurement purposes, in order thus to measure each line element 8. The respective sensor line 22 is used as return line 32 in the exemplary embodiment. As an alternative, a respective strand of a pair of strands 14 is used as return line 32 for the other strand, to be measured, of the pair of strands 14. If for example transmission occurs during a measurement, then the transmission pause is interrupted, and the signal unit 18 is thus designed such that it "notes" the last measured pair of strands 14 and continues the measurement at the next transmission pause.

The measuring arrangement described here therefore combines the following state checks:

a) detecting transmission pauses on the basis of the crosstalk signal,
b) alternately checking the line elements (using a "reflection measurement", in particular in accordance with the method described in WO 2017/216061 A1),
c) optionally detecting the temperature (using a "reflection measurement" influenced by the dielectric between the inner conductor and outer conductor of the sensor line).

The invention is not restricted to the exemplary embodiment described above. Other variants of the invention may rather be derived therefrom by a person skilled in the art without departing from the subject matter of the invention. All of the individual features described in connection with the exemplary embodiment are furthermore in particular also able to be combined with one another in other ways without departing from the subject matter of the invention.

The invention claimed is:

1. A measuring arrangement for monitoring a cable including a cable core having at least one electrical line element for transmitting electrical data or electric power, the measuring arrangement comprising:
   a signal unit for feeding a measurement signal into the cable core and for detecting a response signal;
   a sensor unit having a sensor line extending in a longitudinal direction of the cable and being disposed inside the cable core;
   a monitoring unit configured to detect transmission pauses in a transmission of the electrical data or of the electric power; and
   an evaluation unit;
   said signal unit being electrically connected to said at least one line element for feeding in the measurement signal, said signal unit being configured for feeding the measurement signal into the at least one line element during operation based on the detected transmission pauses, and said signal unit being configured for detecting the response signal and for transmitting the response signal to said evaluation unit for evaluation.

2. The measuring arrangement according to claim 1, which further comprises an outer shield surrounding the cable core, said outer shield being electrically connected to said sensor line by said monitoring unit, and said monitoring unit being configured for detecting and monitoring the transmission of the electrical data or of the electric power based on a crosstalk signal coupled into said outer shield.

3. The measuring arrangement according to claim 2, wherein said monitoring unit has a comparator for comparing the crosstalk signal coupled into said outer shield with a predefined comparison voltage.

4. The measuring arrangement according to claim 1, wherein said sensor line has an inner conductor, an outer conductor and a dielectric dependent on a state variable.

5. The measuring arrangement according to claim 4, wherein said outer conductor is connected both to said signal unit and to said monitoring unit for detecting and evaluating the state variable.

6. The measuring arrangement according to claim 1, wherein said signal unit is electrically connected to each of a plurality of line elements of the cable core, and said signal unit is configured for feeding the measurement signal into a respective line element in the transmission pauses.

7. The measuring arrangement according to claim 6, wherein said signal unit has a changeover switch element connecting the line elements to said signal unit and permitting the measurement signal to be fed alternately into the line elements during operation.

8. The measuring arrangement according to claim 1, wherein said sensor line is a return line for the response signal.

9. The measuring arrangement according to claim 1, wherein the response signal is a measurement signal component reflected by the cable core to said signal unit.

10. The measuring arrangement according to claim 9, wherein the measuring arrangement is configured to detect a transmission impairment by detecting and evaluating a time of flight of the response signal.

11. The measuring arrangement according to claim 10, wherein:
   said signal unit is configured to perform a plurality of individual measurements in a course of a measurement cycle;
   the measurement signal is fed into said line elements by said signal unit per individual measurement;
   a stop signal is generated in the event of a predefined threshold value being exceeded as a result of the reflected measurement signal component;
   a time of flight between the infeed of the measurement signal and the stop signal is ascertained; and
   the threshold value is changed between the individual measurements.

12. The measuring arrangement according to claim 1, wherein the at least one electrical line element has an unshielded pair of strands or a twisted unshielded pair of strands.

13. The measuring arrangement according to claim 1, wherein said sensor line is disposed centrally in the cable core and is surrounded by a plurality of line elements.

14. A method for monitoring a cable extending in a longitudinal direction, the method comprising:
   providing the cable having a cable core with at least one electrical line element for transmitting electrical data or electric power;
   detecting transmission pauses in a transmission of the electrical data or of the electric power;
   using a signal unit to feed a measurement signal into the cable core and to detect a response signal;
   feeding the measurement signal into the at least one line element based on the detected transmission pauses; and
   detecting the response signal and transmitting the response signal to an evaluation unit for evaluation.

15. The method according to claim 14, which further comprises detecting the transmission pauses on a basis of a crosstalk signal caused by the transmission of the electrical data or of the electric power.

* * * * *